United States Patent
Yin et al.

(10) Patent No.: US 8,564,029 B2
(45) Date of Patent: *Oct. 22, 2013

(54) TRANSISTOR AND METHOD FOR FORMING THE SAME

(75) Inventors: Haizhou Yin, Poughkeepsie, NY (US); Huilong Zhu, Poughkeepsie, NY (US); Zhijong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/112,989

(22) Filed: May 20, 2011

(65) Prior Publication Data

US 2012/0104473 A1    May 3, 2012

Related U.S. Application Data

(63) Continuation of application No. PCT/CN2011/000262, filed on Feb. 21, 2011.

(30) Foreign Application Priority Data

Oct. 29, 2010  (CN) .......................... 2010 1 0532062

(51) Int. Cl.
    *H01L 29/78*  (2006.01)

(52) U.S. Cl.
    USPC .................. 257/288; 257/327; 257/E29.255; 257/E21.409; 257/E21.441; 438/285; 438/308

(58) Field of Classification Search
    USPC .................. 257/288, 327, E21.409, E21.441, 257/E29.255; 438/308, 285
    See application file for complete search history.

(56) References Cited

U.S. PATENT DOCUMENTS

| | | | |
|---|---|---|---|
| 2004/0033649 A1 | 2/2004 | Noda | 438/197 |
| 2005/0017309 A1* | 1/2005 | Weber et al. | 257/376 |
| 2005/0148134 A1 | 7/2005 | Dokumaci et al. | 438/199 |
| 2005/0196925 A1 | 9/2005 | Kim et al. | 438/285 |
| 2010/0038685 A1* | 2/2010 | Weber et al. | 257/288 |
| 2010/0148270 A1* | 6/2010 | Golonzka et al. | 257/369 |
| 2012/0104474 A1* | 5/2012 | Yin et al. | 257/288 |

* cited by examiner

*Primary Examiner* — Thinh T Nguyen
(74) *Attorney, Agent, or Firm* — Martine Penilla Group, LLP

(57) ABSTRACT

The present invention relates to a transistor and the method for forming the same. The transistor of the present invention comprises a semiconductor substrate; a gate dielectric layer formed on the semiconductor substrate; a gate formed on the gate dielectric layer; a channel region under the gate dielectric layer; and a source region and a drain region located in the semiconductor substrate and on respective sides of the channel region, wherein at least one of the source and drain regions comprises a set of dislocations that are adjacent to the channel region and arranged in the direction perpendicular to a top surface of the semiconductor substrate, and the set of dislocations comprises at least two dislocations.

5 Claims, 9 Drawing Sheets

US 8,564,029 B2

TRANSISTOR AND METHOD FOR FORMING THE SAME

This application claims priority under 35 U.S.C. §§120 and 365(c) as a continuation application of prior International Application No. PCT/CN2011/000262, filed Feb. 21, 2011, and which was not published in English under PCT Article 21(2). The PCT/CN2011/000262 application in turn claims priority to Chinese Application No. CN 201010532062.9, filed on Oct. 29, 2010. The disclosures of the prior international application and Chinese application are incorporated herein by reference.

FIELD OF THE INVENTION

The present invention relates to the field of semiconductor device manufacturing, and particularly, to a transistor and a method for forming the same.

BACKGROUND OF THE INVENTION

Typically, integrated circuits comprise a combination of N-type Metal Oxide Semiconductor (NMOS) and P-type Metal Oxide Semiconductor (PMOS) transistors formed on a substrate. The performance of an integrated circuit is directly related to the performance of transistors which it comprises. Therefore, it is desirable to improve the driving current of a transistor so as to enhance the performance thereof.

U.S. patent application No. 2010/0038685A1 discloses a transistor in which dislocations are formed between the channel region and the source/drain region. The dislocations may cause tensile stress, which may improve the electron mobility in the channel and thus increase the driving current in the transistor. FIGS. 12a-12c in the present application show the formation of such dislocations. In FIG. 12a, silicon is implanted into a semiconductor substrate 1 on which a gate dielectric layer 2 and a gate 3 have been formed, so as to form amorphous regions as indicated by the shaded portions in the figure. Then the semiconductor substrate 1 is annealed so as to re-crystallize the amorphous regions. As indicated by the arrows in FIG. 12b, the crystal growth front in the horizontal direction and the crystal growth front in the vertical direction meet during the process of the re-crystallization. As a result, dislocations are formed as shown in FIG. 12c.

SUMMARY OF THE INVENTION

An object of the present invention is to provide a transistor and a method for forming the same.

The method for forming a transistor comprises forming a gate dielectric layer on a semiconductor substrate;

forming a gate on the gate dielectric layer;

performing a first ion implantation with a first implantation depth in a first region and a second region of the semiconductor substrate located in the substrate on respective sides of the gate;

performing annealing to form a dislocation in each of the first and second regions after the first ion implantation;

performing a second ion implantation with a second implantation depth smaller than the first implantation depth on one or both of the first and second regions; and performing annealing after the second ion implantation to form a dislocation in each of the first and second regions.

The method for forming a transistor according to the present invention produces more dislocations adjacent to the channel region as compared with the prior art by performing amorphization and re-crystallization with different depths in the source and drain regions. More dislocations create more tensile stress applied to the channel, which makes it possible to increase the electron mobility in the channel region.

The transistor according to the present invention comprises a semiconductor substrate;

a gate dielectric layer formed on the semiconductor substrate;

a gate formed on the gate dielectric layer;

a channel region under the gate dielectric layer; and a source region and a drain region located in the semiconductor substrate and on respective sides of the channel region, wherein at least one of the source and drain regions comprises a set of dislocations that are adjacent to the channel region and arranged in the direction perpendicular to a top surface of the semiconductor substrate, and the set of dislocations comprises at least two dislocations.

Due to the fact that there are more dislocations adjacent to the channel region in the transistor of the present invention as compared with the prior art, the tensile stress applied to the channel region is increased and thus the electron mobility in the channel region can be further increased.

Other aspects and advantages of the present invention will be detailed hereinafter in combination with the accompanying drawings.

DETAILED DESCRIPTION OF THE PREFERRED EMBODIMENTS

The preferred embodiments of the present invention will be detailed in the following in combination with the accompanying drawings. The drawings are drawn schematically and not to scale for the purpose of illustrating the embodiments of the present invention rather than limiting the protection scope thereof. The same reference numbers are used to indicate same or similar components throughout the drawings. Processes and device structures that are well known in the art are omitted here in order to make the technical solutions of the present invention clearer.

<The First Embodiment>

Figure 1:
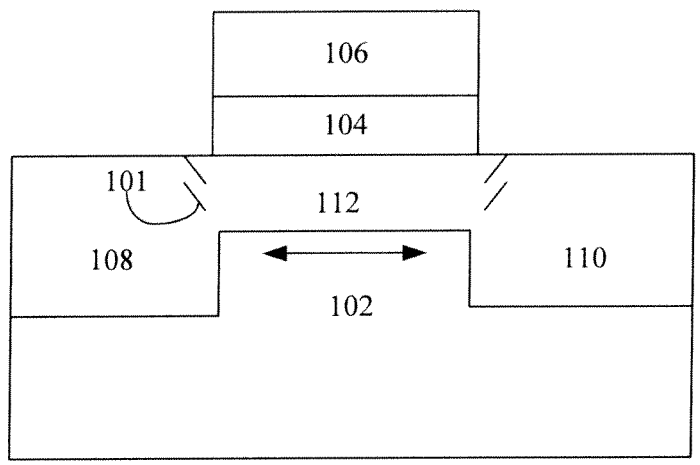
FIG. 1 schematically illustrates a transistor according to a first embodiment of the present invention.

FIG. 1 schematically illustrates a transistor according to a first embodiment of the present invention. As shown in FIG. 1, a transistor 100 comprises a semiconductor substrate 102, a gate dielectric layer 104 formed on the semiconductor substrate 102, a gate 106 formed on the gate dielectric layer 104, a source region 108 and a drain region 110 on respective sides of the gate 106, and a channel region 112 under the gate dielectric layer 104 and between the source region 108 and the drain region 110. In the transistor 100 shown in FIG. 1, each of the source region 108 and the drain region 110 comprises a set of dislocations that are adjacent to the channel region 112 and arranged in the direction perpendicular to the top surface of the semiconductor substrate, and each set of dislocations comprises two dislocations 101. The dislocations apply tensile stress to the channel region 112 as indicated by the arrow in FIG. 1, which increases the electron mobility in the channel region. Compared with the prior art, more dislocations are formed adjacent to the channel region in the present invention, and thus the tensile stress applied to the channel region 112 is increased, which makes it possible to further increase the electron mobility in the channel region 112.

In addition, the transistor 100 further comprises sidewall spacers formed on the side surfaces of the gate dielectric layer 104 and the gate 106, as well as source and drain contacts, etc., which are well known structures in the art and are thus neither shown in the drawings nor described in detail.

The method for forming the transistor in accordance with the first embodiment will be described hereinafter with reference to FIGS. 2a-d.

Figure 2A:
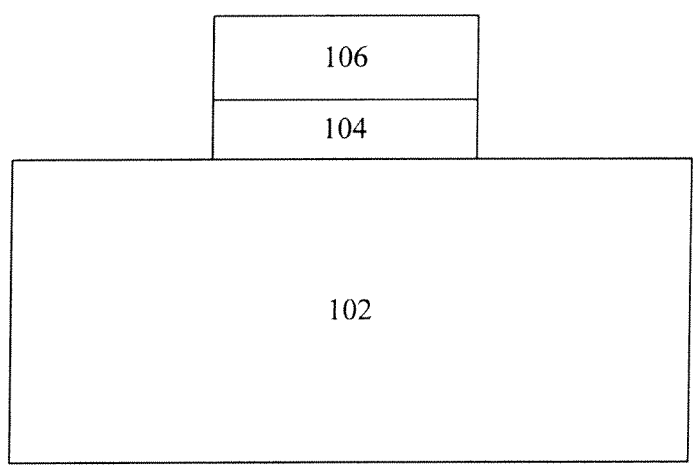
FIGS. 2a-d schematically illustrate the steps of the method for forming the transistor according to the first embodiment of the present invention.
Figure 2B:
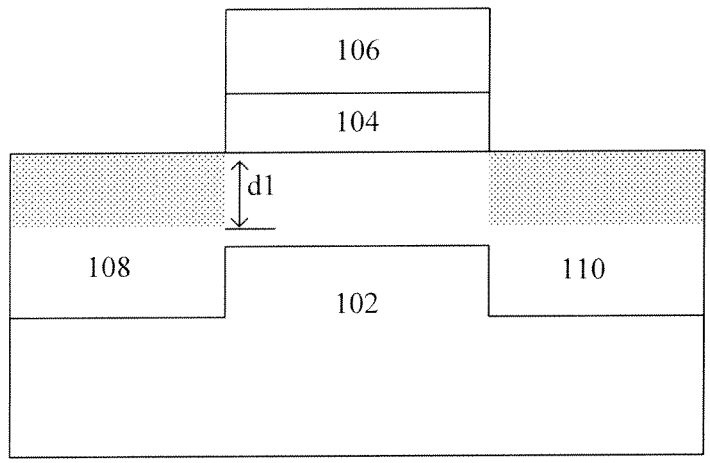

As shown in FIG. 2a, the gate dielectric layer 104 and the gate 106 are formed on the semiconductor substrate 102. Next, as shown in FIG. 2b, a first ion implantation with a first implantation depth d1 is performed in a first region 108 and a second region 110 that are located in the semiconductor substrate 102 and on respective sides of the gate 106, so that an amorphous region (as shown by the shaded portions in FIG. 2b) is formed in both of the first region 108 and the second region 110. The first region 108 and the second region 110 are regions in which the drain and the source of the transistor are to be formed respectively, or regions in which the drain and the source of the transistor have been formed by performing ion implantation. An annealing is performed subsequent to the step shown in FIG. 2b so that the amorphous regions are re-crystallized. During the process of the re-crystallization, different growth fronts of the crystal meet, and as a result, dislocations (as shown in FIG. 2c) are formed in both of the first region 108 and the second region 110 and adjacent to the region on which the conductive channel is to be formed under the gate dielectric layer 104.

Figure 2C:
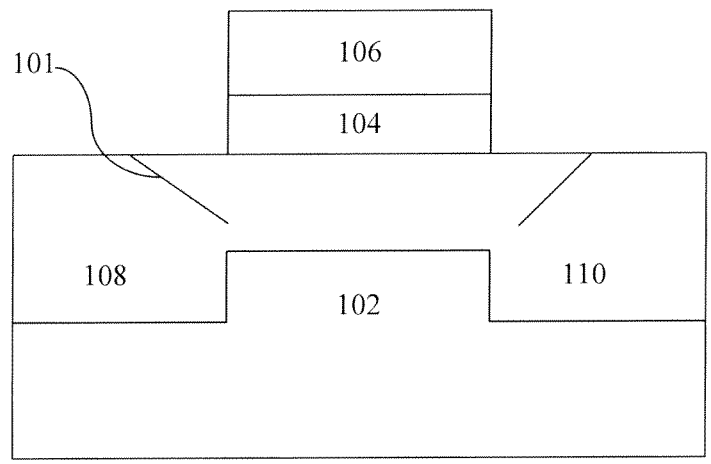
Figure 2D:
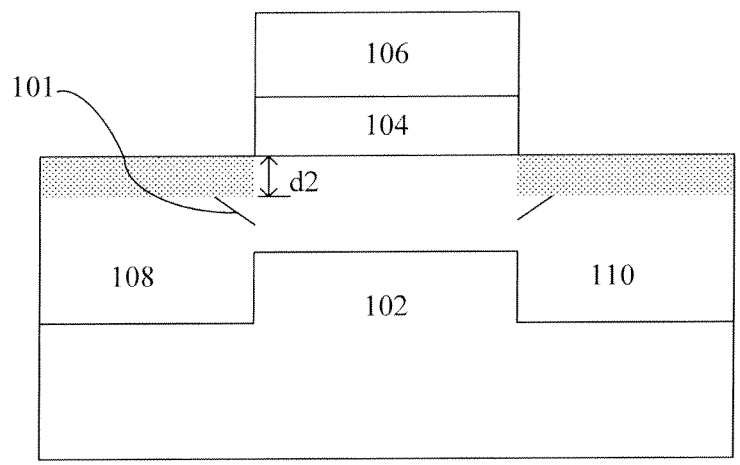

Next, a second ion implantation with a second implantation depth d2 that is smaller than d1 is performed in the structure shown in FIG. 2c, so as to form amorphous regions as shown in FIG. 2d. The ion implantation depth can be controlled by adjusting the energy and dose of the ion implantation. Subsequently, an annealing is performed on the structure shown in FIG. 2d, so as to obtain the structure shown in FIG. 1.

<The Second Embodiment>

Figure 3:
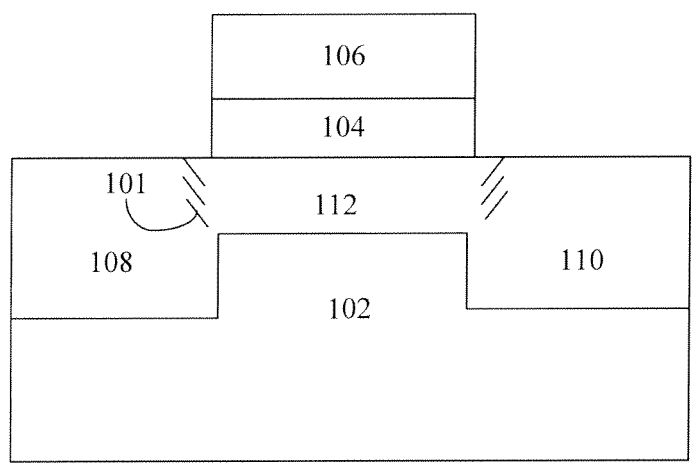
FIG. 3 schematically illustrates a transistor according to a second embodiment of the present invention.

FIG. 3 schematically shows the transistor according to the second embodiment of the present invention. The transistor 200 shown in FIG. 3 is different from the transistor 100 shown in FIG. 1 in that each of the source region 108 and the drain region 110 comprises a set of three dislocations that are adjacent to the channel region 112 and arranged in the direction perpendicular to the top surface of the semiconductor substrate 102.

Figure 4:
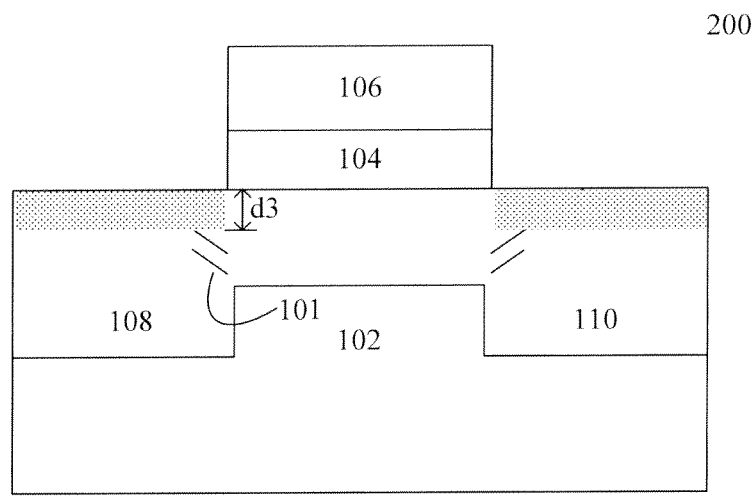
FIG. 4 schematically illustrates one of the steps of the method for forming the transistor according to the second embodiment of the present invention.

Accordingly, compared with the method for forming the transistor 100, the method for forming the transistor 200 in accordance with the present embodiment further comprises a step of performing a third ion implantation in the first region 108 and the second region 110 with an implantation depth d3 that is smaller than the second implantation depth d2, as shown in FIG. 4.

Although FIG. 3 shows that each set of dislocations in the source region 108 and the drain region 110 comprise three dislocations, the present invention is not limited thereto. Each set of dislocations in the source region 108 and the drain region 110 may comprise more dislocations. Accordingly, said more dislocations can be formed by performing more ion implantations with different implantation depths, and the implantation depth of a later ion implantation is smaller than that of a former one.

According to the present embodiment, more dislocations can be formed adjacent to the channel region as required, and thus the tensile stress applied to the channel region is further enhanced, which accordingly makes it possible to further increase the electron mobility of the channel region.

<The Third Embodiment>

Figure 5:
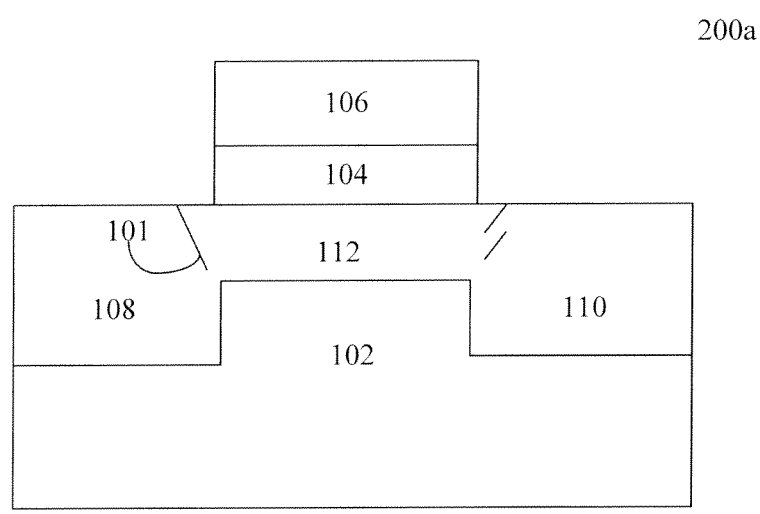
FIG. 5 schematically illustrates a transistor according to a third embodiment of the present invention.

Although the dislocations in the source region and those in the drain region are symmetrical to each other in the above description of the first and second embodiments, the present invention is not limited thereto. By completely covering one of the first and second regions with a mask layer before any one of the ion implantations and only performing the ion implantation in the other thereof, dislocations can be formed asymmetrically in the source region 108 and the drain region 110. As an example, before the second ion implantation, a mask layer is formed on the first region 108 but not on the second region 110 so that the second ion implantation is not performed in the first region 108. In such a way, the first region 108 comprises only one dislocation while the second region 110 comprises a set of two dislocations in the direction perpendicular to the top surface of the semiconductor substrate 102 in the resulting transistor 200a, as shown in FIG. 5.

<The Fourth Embodiment>

Figure 6:
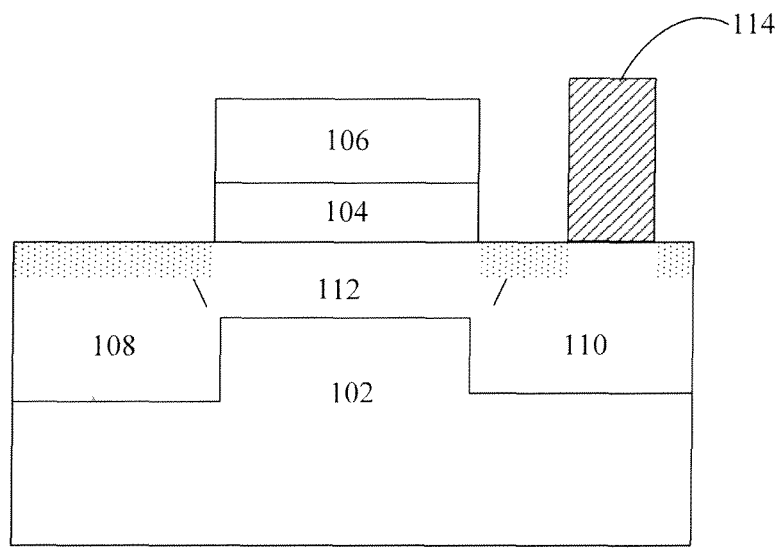
FIG. 6 schematically illustrates one of the steps of a method for forming a transistor according to a fourth embodiment of the present invention.
Figure 7:
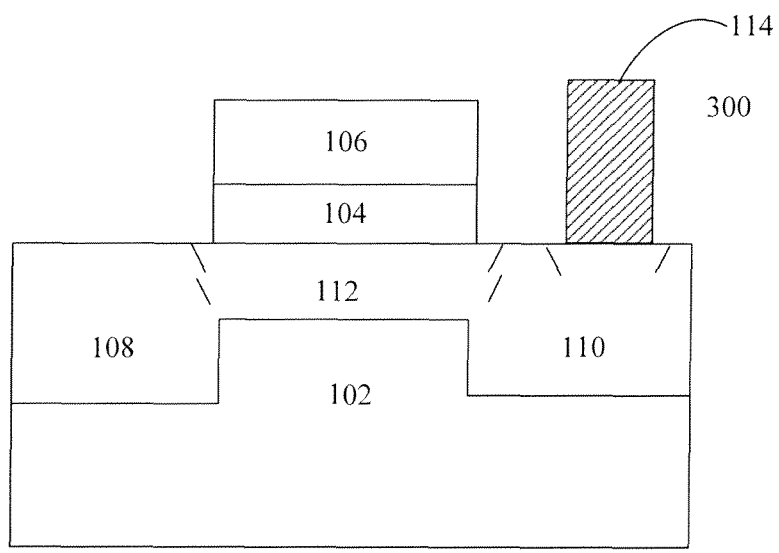
FIG. 7 schematically illustrates the transistor according to the fourth embodiment of the present invention.

The method for forming the transistor according the present embodiment is different from those of the first and second embodiments in that a mask layer may be selectively formed on at least one of the first region 108 and the second region 110 before one or more of the ion implantations, to cover a portion of the at least one of the first region 108 and the second region 110 and, in a preferred embodiment, a portion of the at least one of the first region 108 and the second region 110 that abuts on the gate is exposed. In a non-limiting example, in addition to carrying out the steps of the method in the first embodiment, a mask layer 114 is formed on the second region 110 so as to cover a portion thereof before the second ion implantation. FIG. 6 shows a structure obtained from the second ion implantation subsequent to the step of forming the mask layer 114, in which structure ion implantation is not performed to the portion of the second region 110 that is covered by the mask layer 114. An annealing is performed on the structure shown in FIG. 6 to obtain the transistor 300 shown in FIG. 7. Although the mask layer 114 is also shown in FIG. 7, it may have been removed before the annealing in practice.

The mask layer may be a photoresist layer or a hard mask layer formed of a dielectric material such as silicon oxide and/or silicon nitride. The selective formation of the hard mask layer may be performed by, for example, the photolithography process that is well known in the art. In the case that mask layers are selectively formed before more than one of the ion implantations, the patterns of the mask layers formed at one time may be the same or vary from one mask layer to another. In one preferred embodiment, the mask layer is formed of a dielectric material such as silicon oxide and/or silicon nitride, and thus there is no need to remove the mask layers during the process of annealing in the case where the patterns of the mask layers are the same, so that the step of forming the mask layer only need to be performed once.

Figure 8:
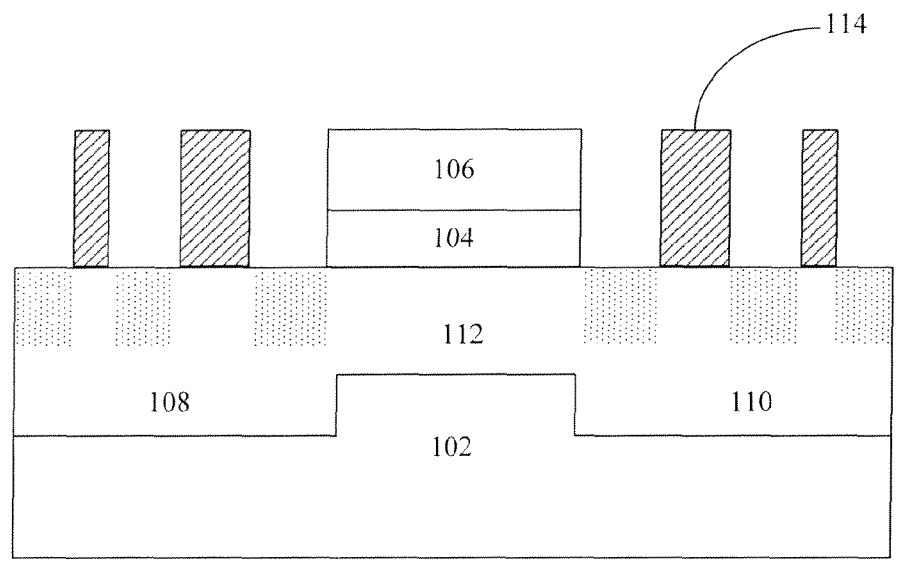
FIG. 8 schematically illustrates one of the steps of the method for forming the transistor according to a variation of the fourth embodiment of the present invention.
Figure 9:
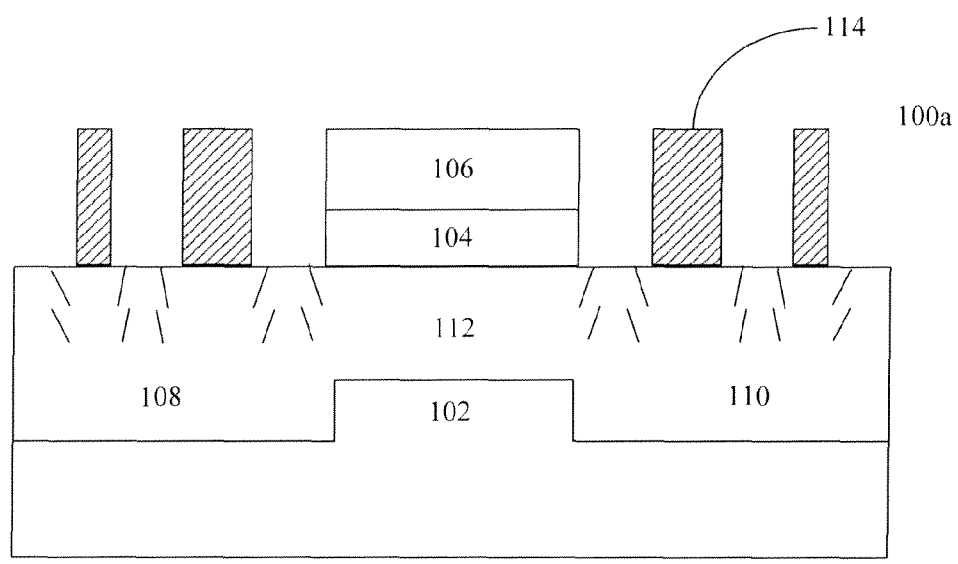
FIG. 9 schematically illustrates the transistor according to the variation of the fourth embodiment of the present invention.

As a variation of the fourth embodiment, a mask layer may be selectively formed on at least one of the first region 108 and the second region 110 before one or more of the ion implantations so as to cover at least two portions thereof that are not adjacent to each other. As a non-limiting example, in addition to performing steps in the method of the first embodiment, a mask layer 114 is formed on both of the first region 108 and the second region 110 so as to cover two portions thereof that are not adjacent to each other before performing the first and second ion implantations, respectively. The first ion implantation is then performed and a structure is obtained as shown in FIG. 8. Next, the second ion implantation and a corresponding annealing are performed without removing the mask layer 114. It is to be noted that positions of the mask layer 114 on the first region 108 and the second region 110 may be symmetrical or asymmetrical with respect to the gate 106 of the transistor 100. The resulting transistor 100a formed in this example is schematically shown in FIG. 9. Although the mask layer 114 is also shown in FIG. 9, it may have been removed before the annealing in practice.

In another non-limiting example, the mask layer 114 is formed only on one of the first region 108 and the second region 110 so as to cover two portions thereof that are not adjacent to each other, while no mask layer is formed on the other one of the first region 108 and the second region 110, or the other one of the first region 108 and the second region 110 is completely covered by the mask layer.

Figure 10:
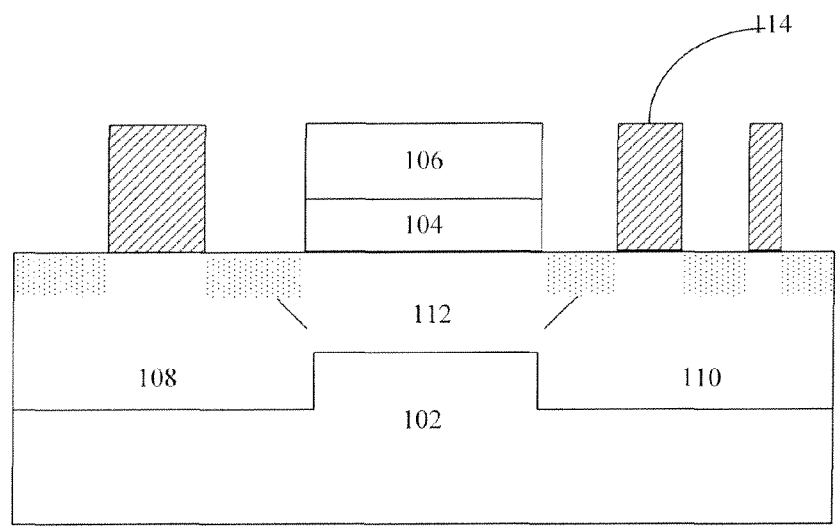
FIG. 10 schematically illustrates one of the steps of the method for forming a transistor according to a further variation of the fourth embodiment of the present invention.
Figure 11:
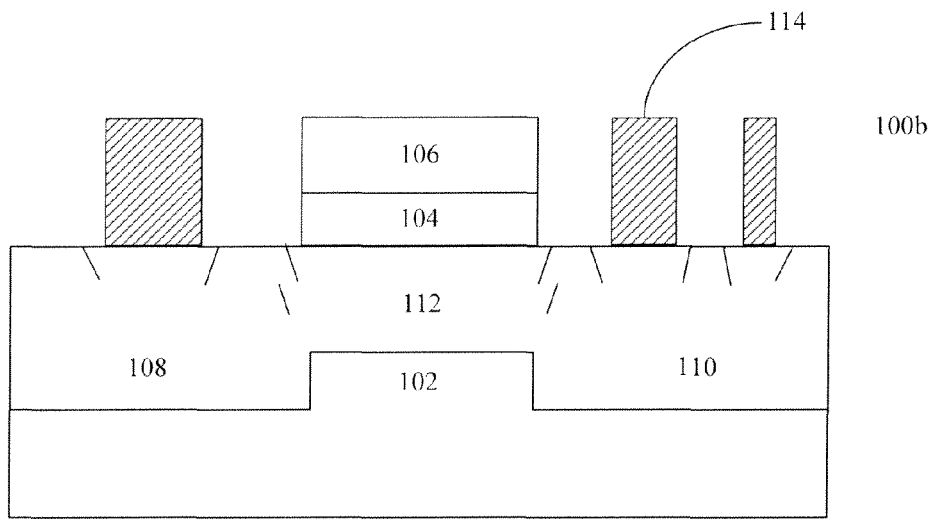
FIG. 11 schematically illustrates the transistor according to the further variation of the fourth embodiment of the present invention.
Figure 12A:
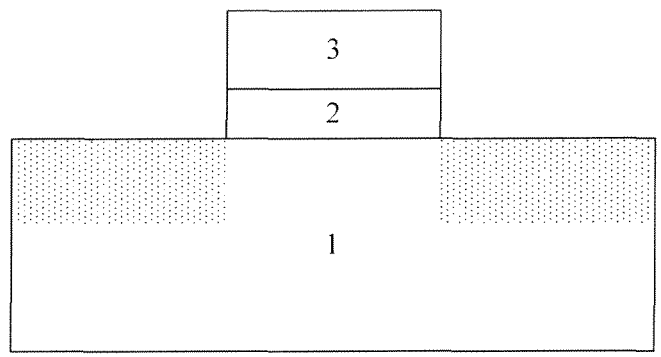
FIGS. 12a-c illustrate the formation of dislocations in the prior art.
Figure 12B:
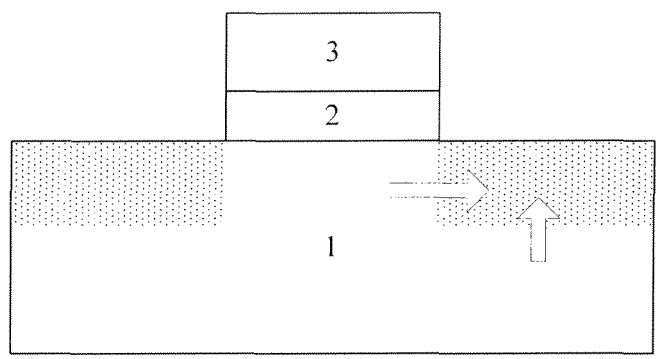
Figure 12C:
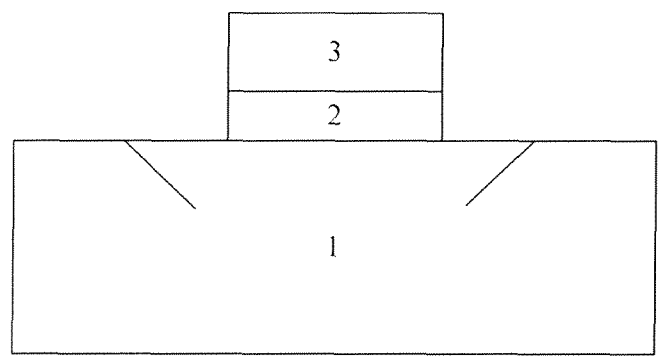

In another variation of the fourth embodiment, a mask layer is selectively formed on one of the first region 108 and the second region 110 to cover two portions thereof that are not adjacent to each other before one or more of the ion implantations, while the mask layer is selectively formed on the other one of the first region 108 and the second region 110 to cover a portion thereof. In a non-limiting example, in addition to performing the steps of the method in the first embodiment, before performing the second ion implantation, the mask layer 114 is formed on the first region 108 so as to cover a portion thereof, and the mask layer 114 is formed on the second region 110 so as to cover two portions thereof that are not adjacent to each other. The second ion implantation is then performed so as to obtain the structure shown in FIG. 10. FIG. 11 schematically shows the resulting transistor 100b obtained in this example. Although the mask layer 114 is shown in FIG. 11, it may have been removed before annealing in practice.

In summary, the transistor according to the fourth embodiment comprises at least a further dislocation in at least one of the source region and the drain region that is farther from the channel region than the dislocations formed in the first and second embodiments.

The direction that is parallel to the surface of the substrate is defined as the horizontal direction of the transistor, and the direction that is perpendicular to the surface of the substrate is defined as the vertical direction of the transistor. Compared with the first, second and third embodiments, the fourth embodiment and its variations further obtain more dislocations in the horizontal direction of the transistor in addition to more dislocations in the vertical direction of the transistor, which makes it possible for the tensile stress applied to the channel region (and thus the electron mobility of the channel region) to be further increased.

The transistors in accordance with the first to fourth embodiments and the variations thereof may be NMOS transistors.

In the method for forming the transistor in accordance with the first to fourth embodiments and the variations thereof, the semiconductor substrate may comprise an NMOS device region and a PMOS device region, and the methods for forming the transistors in accordance with the present invention are performed only in the NMOS device region.

In the first to fourth embodiments and the variations thereof, the transistors may also comprise a semiconductor layer (not shown), for example, a layer of Si, SiC, SiGe or Ge, on the source region 108 and the drain region 110, which makes the dislocations not to be exposed to a free surface. Accordingly, the method for forming the transistor comprises forming the semiconductor layer on the source and drain regions after the doping steps for forming the source and the drain. The fact that the semiconductor layer makes the dislocations not to be exposed to a free surface prevents the decrease of the tensile stress due to exposure of dislocations to a free surface.

In the first to fourth embodiments and the variations thereof, the ions implanted in the ion implantations may be one of Si, Ge, P, B and As or any combination thereof.

In the first to fourth embodiments and the variations thereof, the annealing temperature may be greater than 400° C., preferably 500° C.-900° C., and the annealing time may be in the range of several seconds to several minutes.

The doping of the source and the drain, the formation of the sidewall spacer, the formation of the source/drain contact and so on that are well known in the art may be performed after the steps of the method described in the first to fourth embodiments and the variation thereof, thereby forming a complete device.

Although in the above descriptions, the doping processes for forming the source and the drain are performed after the formation of the dislocations, the present invention is not limited thereto. The dislocations may be formed in any suitable stage, for example, the dislocations may be formed after the doping of the source and the drain.

Furthermore, the semiconductor substrate mentioned above may be a silicon substrate, a SiGe substrate, a SiC substrate or an III-V semiconductor (for example, GaAs, GaN, etc.) substrate. The gate dielectric layer may use one of $SiO_2$, $HfO_2$, HfSiO, HfSiON, HfTaO, HfSiO, HfZrO, $Al_2O_3$, $La_2O_3$, $ZrO_2$ and LaAlO or any combination thereof, and the material of the gate may be selected from a group comprising Poly-Si, Ti, Co, Ni, Al, W, the alloy thereof and the silicide thereof.

The transistor and the method for forming the same according to the present invention are described by way of exemplary embodiments hereinbefore. However, the scope of the present invention does not intend to be limited thereto. Any modifications or variations of the above embodiments that can be contemplated by one skilled in the art will fall within the scope of the present invention defined by the appended claims.

What is claimed is:

1. A transistor, comprising
a semiconductor substrate;
a gate dielectric layer formed on the semiconductor substrate;
a gate formed on the gate dielectric layer;
a channel region under the gate dielectric layer; and
a source region and a drain region located in the semiconductor substrate and on respective sides of the channel region,
wherein at least one of the source and drain regions comprises a first set of dislocations that are adjacent to the channel region and arranged in the direction perpendicular to a top surface of the semiconductor substrate, and the set of dislocations comprises at least two dislocations, and wherein the bottom of the dislocation that is closer to the channel region is substantially flush with the top of the dislocation that is more far away from the channel region.

2. The transistor according to claim 1, wherein at least one of the source and drain regions comprises at least one further dislocation that is farther from the channel region than the first set of dislocations.

3. The transistor according to claim 1, wherein at least one of the source and drain regions comprises at least one further set of dislocations arranged in the direction perpendicular to the top surface of the substrate, and the at least one further set of dislocations comprises at least two dislocations farther from the channel region than the first set of dislocations.

4. The transistor according to claim 1, wherein the dislocations apply tensile stress to the channel region between the source and drain regions, which increases the electron mobility in the channel region.

5. The transistor according to claim 1, wherein the transistor is an NMOS transistor.

* * * * *